(12) United States Patent
Song et al.

(10) Patent No.: US 9,629,108 B2
(45) Date of Patent: Apr. 18, 2017

(54) APPARATUS AND METHOD FOR CONTROLLING POWER AMPLIFIER BIAS

(71) Applicant: Samsung Electronics Co., Ltd., Gyeonggi-do (KR)

(72) Inventors: Seong Jun Song, Gyeonggi-do (KR); Kyung Jung Kim, Gyeonggi-do (KR); Won Gon Park, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 14/707,602

(22) Filed: May 8, 2015

(65) Prior Publication Data
US 2015/0326258 A1 Nov. 12, 2015

(30) Foreign Application Priority Data
May 8, 2014 (KR) .................. 10-2014-0054515

(51) Int. Cl.
*H01Q 11/12* (2006.01)
*H04W 52/52* (2009.01)
*H04B 1/04* (2006.01)
*H03F 3/21* (2006.01)
*H03F 3/19* (2006.01)
*H04B 17/318* (2015.01)
*H04L 1/20* (2006.01)
*H04B 17/382* (2015.01)
*H04W 52/14* (2009.01)
*H04W 52/24* (2009.01)
*H03F 1/02* (2006.01)
(Continued)

(52) U.S. Cl.
CPC .......... *H04W 52/52* (2013.01); *H03F 1/0227* (2013.01); *H03F 3/19* (2013.01); *H03F 3/21* (2013.01); *H03F 3/245* (2013.01); *H04B 1/0475* (2013.01); *H04B 17/318* (2015.01); *H04B 17/382* (2015.01); *H04L 1/20* (2013.01); *H04L 1/203* (2013.01); *H04W 52/146* (2013.01); *H04W 52/241* (2013.01); *H04W 52/246* (2013.01); *H03F 2200/451* (2013.01); *H03F 2200/555* (2013.01); *H04B 2001/0416* (2013.01)

(58) Field of Classification Search
CPC .... H03G 3/3042; H04W 52/14; H04W 52/10; H04W 52/16; H04W 52/18; H04W 52/20; H04W 52/24; H04W 52/241; H04W 52/245; H04W 52/343; H04W 52/40
USPC .................................. 455/127.1, 67.11–67.13
See application file for complete search history.

(56) References Cited

U.S. PATENT DOCUMENTS 6,356,745 B1 * 3/2002 Lee ..................... H04W 52/367
330/129
2002/0021687 A1 * 2/2002 Toki .......................... H03F 1/32
370/345

(Continued)

*Primary Examiner* — Lee Nguyen
(74) *Attorney, Agent, or Firm* — The Farrell Law Firm, P.C.

(57) ABSTRACT

An electronic device and a bias control method thereof are provided. The electronic device includes a channel quality measuring module configured to measure a channel quality of a received signal, a bias offset determining module configured to determine a bias offset based on the measured channel quality, a bias offset applying module configured to modify a bias by applying the determined bias offset to a specified bias value, and a power amplifier configured to amplify transmission power according to the modified bias.

20 Claims, 11 Drawing Sheets

(51) Int. Cl.
*H03F 3/24* (2006.01)
*H04B 1/034* (2006.01)

(56) References Cited

U.S. PATENT DOCUMENTS

| | | | |
|---|---|---|---|
| 2009/0052426 A1* | 2/2009 | Perraud | H04W 52/146 370/338 |
| 2010/0291975 A1* | 11/2010 | Dimpflmaier | H03F 1/0211 455/572 |
| 2012/0314606 A1* | 12/2012 | Takano | H04W 36/0072 370/252 |
| 2013/0195219 A1 | 8/2013 | Vinayagamoorthy et al. | |
| 2013/0329570 A1* | 12/2013 | Wang | H04L 1/0032 370/242 |

* cited by examiner

APPARATUS AND METHOD FOR CONTROLLING POWER AMPLIFIER BIAS

PRIORITY

This application claims priority under 35 U.S.C. §119(a) to a Korean Patent Application filed the Korean Intellectual Property Office on May 8, 2014 and assigned Serial number 10-2014-0054515, the entire content of which is incorporated herein by reference.

BACKGROUND OF THE INVENTION

1. Field of the Invention

The present invention relates generally to control of a power amplifier, and more particularly, to a device and method for controlling a power amplifier bias applied to a power amplifier according to a communication environment.

2. Description of the Related Art

An electronic device may implement a wireless communication function by receiving or transmitting signals using an antenna included in the electronic device. The antenna is able to efficiently restore an original signal from a signal detected from a free space using a filtering function and amplification (e.g., low noise amplification) function, even if the strength of the detected signal is low. However, when the antenna transmits a signal through free space to an entity a great distance from the electronic device (e.g., another terminal, a base station, or a network), the electronic device must sufficiently amplify transmission power (e.g., power amplification) in order to deliver the signal. In order to enable transmission over greater distances, the electronic device uses a Power Amplifier (PA) to amplify power at a transmitting end. The PA may be operated using specified Direct Current (DC) power, i.e., a bias voltage, as a power source.

In a power amplifier control method according to the related art, the same PA bias value is applied to a frequency band (e.g., 1920 MHz to 1980 MHz for an uplink, 2110 MHz to 2170 MHz for a downlink, 2×60 MHz band in total) corresponding to one RF band (e.g., band 1 of WCDMA), in order to reduce power consumption of a power amplifier.

However, according to this power amplifier control method, since a low bias value may be applied even to some channels having a poor PA linearity, such as an Adjacent Channel Leakage Ratio (ACLR) among a plurality of channels existing within one band, reception sensitivity degradation may occur due to transmission. Furthermore, since the same bias value is used for both data communication and a voice call, a bias value for optimizing current consumption for the voice call may also be used for the data communication. As a result, according to the power amplifier method according to the related art, performance degradation may occur in a data mode for which a greater ACLR performance is required.

In contrast to a typical LTE terminal, a terminal that supports Carrier Aggregation (CA) of LTE-Advanced (LTE-A) technology may be additionally provided with a wideband coupler, or an antenna switch and a diplexer, for separating high and low bands between an antenna and a duplexer. Due to such additional elements, a transmission path loss may be increased by 1 dB to 3 dB in an electronic device that supports the CA. To compensate for this loss, the terminal must increase an output of a voltage amplifier by 1 dB, so that current consumption of the voltage amplifier increases. For example, if a maximum transmission power is increased by 1 dB to 3 dB, the terminal consumes as much as several tens or several hundreds of milliampere of additional current, thereby degrading the PA linearity.

SUMMARY OF THE INVENTION

The present invention has been made to address at least the above problems and/or disadvantages and to provide at least the advantages described below. Accordingly, an aspect of the present invention provides a method for improving power consumption and reception sensitivity by adaptively and differently controlling a PA bias value for each channel according to channel characteristics.

According to an aspect of the present invention, an electronic device is provided. The electronic device includes a channel quality measuring module configured to measure a channel quality of a received signal, a bias offset determining module configured to determine a bias offset based on the measured channel quality, a bias offset applying module configured to modify a bias by applying the determined bias offset to a specified bias value, and a power amplifier configured to amplify transmission power according to the modified bias.

According to another aspect of the present invention, an electronic device is provided. The electronic device includes a communication module configured to measure a channel quality of a received signal; a bias offset determining module configured to determine a bias offset based on the measured channel quality; a bias offset applying module configured to apply the determined bias offset to a specified bias value; and a bias storing module configured to store the bias value to which the bias offset is applied in a bias look-up table.

According to another aspect of the present invention, a bias control method of an electronic device is provided. The method includes measuring a channel quality of a received signal; determining a bias offset based on the measured channel quality; applying the determined bias offset to a specified bias value; and amplifying transmission power according to the bias value to which the bias offset is applied.

BRIEF DESCRIPTION OF THE DRAWINGS

The above and other aspects, features and advantages of the present invention will be more apparent from the following detailed description, taken in conjunction with the accompanying drawings, in which.

DETAILED DESCRIPTION OF EMBODIMENTS OF THE PRESENT INVENTION

Figure 1:
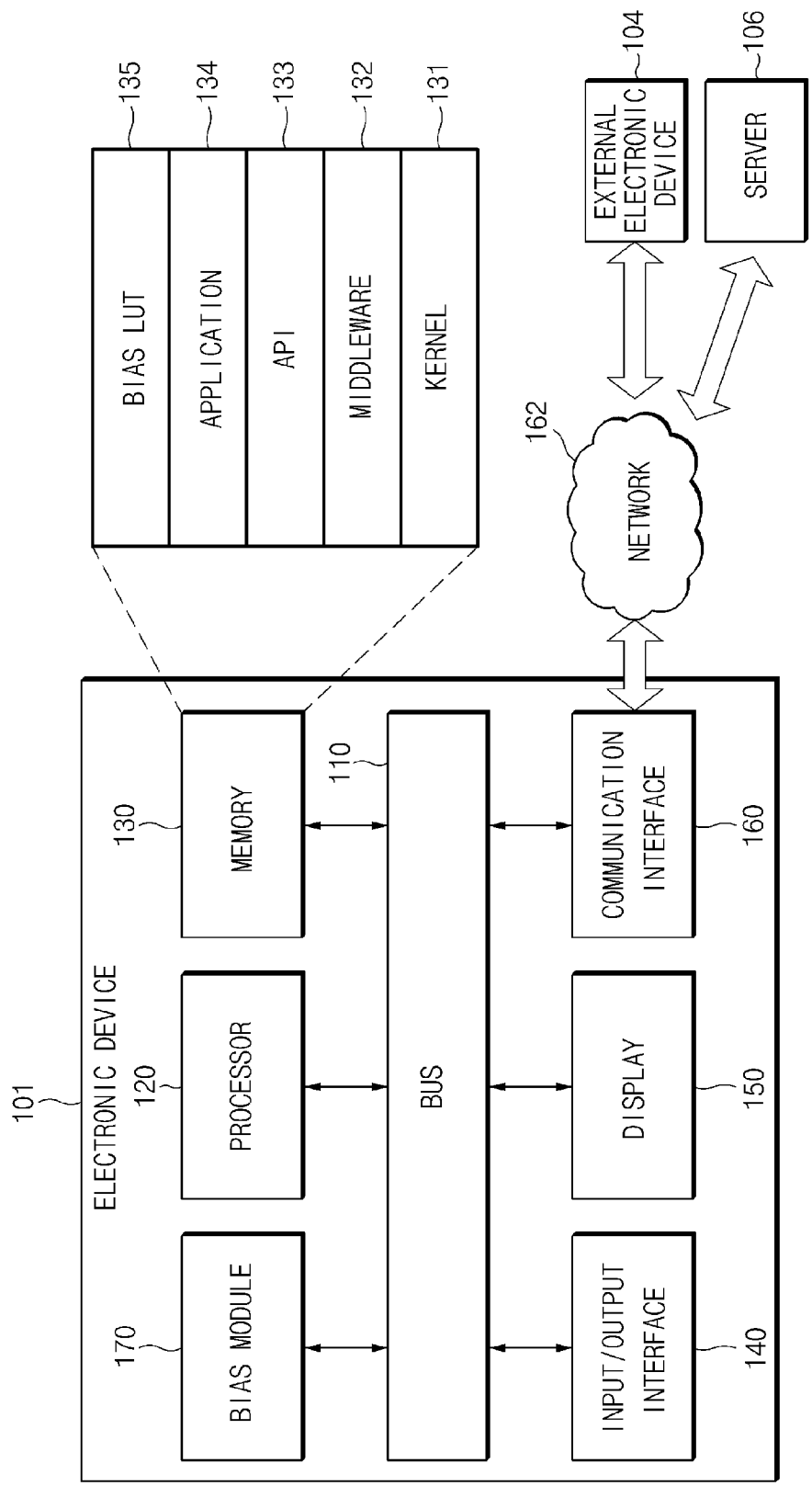
FIG. 1 is diagram illustrating a configuration of an electronic device and a communication environment according to an embodiment of the present invention.

Embodiments of the present invention are described with reference to the accompanying drawings. The same or similar components may be designated by the same or similar reference numerals although they are illustrated in different drawings. Detailed descriptions of constructions or processes known in the art may be omitted to avoid obscuring the subject matter of the present invention.

The terms "include," "comprise," "including," or "comprising", as used herein, indicate functions, operations, or existence of elements but do not exclude other functions, operations or elements. The terms "include", "including", "comprise", "comprising", "have", or "having", as used herein, specify the presence of stated features, numbers, operations, elements, components, or combinations thereof, but do not preclude the presence or addition of one or more other features, numbers, operations, elements, components, or combinations thereof.

The definition of the term "or" or "at least one of A and/or B", as used herein, includes any and all combinations of words listed together with the term. For example, the wording "A or B" or "at least one of A and/or B" may indicate A, B, or both A and B.

Terms such as "first", "second", and the like, as used herein, may refer to various elements of various embodiments of the present invention, but do not limit the elements. For example, such terms do not limit the order and/or priority of the elements. Furthermore, such terms may be used to distinguish one element from another element. For example, a first user device and a second user device indicate different user devices. For example, without departing the scope of the present invention, a first element may be referred to as a second element, and similarly, a second element may be referred to as a first element.

It will be understood that when an element is referred to as being "connected" or "coupled" to another element, that element can be directly connected or coupled to the other element or intervening elements may be present. By contrast, when an element is referred to as being "directly connected" or "directly coupled" to another element, it should be understood that there are no intervening elements.

The terminology used herein is not used to limit embodiments of the present invention and is instead used for describing specific various embodiments of the present invention. A singular form of a term may include plural forms unless otherwise specified.

The terms used herein, including technical or scientific terms, have the same definitions as understood by those skilled in the art unless otherwise defined herein. Commonly used terms such as those defined in a dictionary should be interpreted in the same context as in the related art and should not be interpreted in an idealized or overly formal detect unless otherwise explicitly defined.

Electronic devices according to various embodiments of the present invention may have a communication function. For example, the electronic device may be embodied as at least one of a smartphone, a tablet Personal Computer (PC), a mobile phone, a video telephone, an electronic book reader, a desktop PC, a laptop PC, a netbook computer, a Personal Digital Assistant (PDA), a Portable Media Player (PMP), a Motion Picture Experts Group (MPEG-1 or MPEG-2) Audio Layer 3 (MP3) player, a mobile medical device, a camera, or a wearable device (e.g., a Head-Mounted Device (HMD) such as electronic glasses, electronic apparel, an electronic bracelet, an electronic necklace, an electronic appcessory, an electronic tattoo, or a smart watch).

According to an embodiment of the present invention, the electronic devices may be a smart home appliance having a communication function. The smart home appliance may include at least one of, for example, a TeleVision (TV), a Digital Versatile Disc (DVD) player, audio, a refrigerator, an air conditioner, a cleaner, an oven, a microwave oven, a washing machine, an air cleaner, a set-top box, a TV box (e.g., Samsung HomeSync™, Apple TV™, or Google TV™), a game console, an electronic dictionary, an electronic key, a camcorder, an electronic picture frame, and the like.

According to an embodiment of the present invention, an electronic device may include at least one of a medical device (e.g., a Magnetic Resonance Angiography (MRA), a Magnetic Resonance Imaging (MRI), a Computer Topography (CT), a scanner, and an ultrasonic device), a navigation device, a Global Positioning System (GPS) receiver, an Event Data Recorder (EDR), a Flight Data Recorder (FDR), a vehicle infotainment device, an electronic equipment for a ship (e.g., a navigation system and a gyrocompass), avionics, a security device, a head unit for a vehicle, an industrial or home robot, an Automatic Teller Machine (ATMs), and a Point of Sales (PoS).

According to an embodiment of the present invention, an electronic device may include at least one of a part of furniture or buildings/structures having communication functions, an electronic board, an electronic signature receiving device, a projector, and measuring an instrument (e.g., a water meter, an electricity meter, a gas meter, and a wave meter). An electronic device according to an embodiment of the present invention may include a combination of the above-described devices. Furthermore, an electronic device according to an embodiment of the present invention may include flexible devices. It would be obvious to those skilled in the art that an electronic device according to an embodiment of the present invention is not limited to the above-described devices.

Hereinafter, electronic devices according to various embodiments of the present invention will be described with reference to the accompanying drawings. The term "user", as used herein, may refer to a person who uses an electronic device or may refer to a device (e.g., an artificial electronic device) that uses the electronic device.

FIG. 1 is diagram illustrating a configuration of an electronic device and a communication environment according to an embodiment of the present invention.

Referring to FIG. 1, an electronic device 101 includes a bus 110, a processor 120, a memory 130, an input/output interface 140, a display 150, a communication interface 160, and a bias module 170.

The bus 110 may be a circuit for connecting the above-described elements to each other and transferring communications (e.g., control messages) between the above-described elements.

The processor 120 may receive a command from another element (e.g., the memory 130, the input/output interface 140, the display 150, the communication interface 160, or the bias module 170) through the bus 110, may interpret the received command, and may perform an operation or data processing according to the interpreted command.

The memory 130 may store a command or data received from or generated by the processor 120 or another element (e.g., the input/output interface 140, the display 150, the communication interface 160, or the bias module 170). The memory 130 may include programming modules such as a kernel 131, a middleware 132, an application programming interface (API) 133, an application 134, or a bias Look-Up Table (LUT) 135. Each programming module may include software, firmware, hardware, or a combination of at least two thereof.

The kernel 131 may control or manage system resources (e.g., the bus 110, the processor 120, or the memory 130) used to perform an operation or a function of another programming module, for example, the middleware 132, the API 133, the application 134, or the bias LUT 135. Furthermore, the kernel 131 may provide an interface for the middleware 132, the API 133, the application 134, or the bias LUT 135 to access individual elements of the electronic device 101 in order to control or manage the elements.

The middleware 132 may serve as an intermediary between the API 133, the application 134 or the bias LUT 135 and the kernel 131 so that the API 133, the application 134 or the bias LUT 135 communicates and exchanges data with the kernel 131. Furthermore, the middleware 132 may perform a control operation (e.g., scheduling or load balancing) with respect to operation requests received from the application 134 by using, e.g., a method of assigning a priority for using system resources (e.g., the bus 110, the processor 120 or the memory 130) of the electronic device 101 to at least one application 134.

The API 133, which is an interface for allowing the application 134 to control a function provided by the kernel 131 or the middleware 132, may include at least one interface or function (e.g., a command) for, for example, file control, window control, image processing, or character control.

According to an embodiment of the present invention, the application 134 may include a Short Message Service (SMS)/Multimedia Messaging Service (MMS) application, an electronic mail application, a calendar application, an alarm application, a health care application (e.g., an application for measuring an amount of exercise or blood sugar), or an environment information application (e.g., an application for providing barometric pressure, humidity or temperature information). Additionally or alternatively, the application 134 may be an application related to information exchange between the electronic device 101 and an external electronic device (e.g., an external electronic device 104 or a server 106). The application related to information exchange may include, for example, a notification relay application for transferring specific information to the external electronic device or a device management application for managing the external electronic device.

For example, the notification relay application may include a function of transferring notification information generated by another application of the electronic device 101 (e.g., an SMS/MMS application, an electronic mail application, a health care application, or an environment information application) to the external electronic device 104 or the server 106. Additionally or alternatively, the notification relay application may receive notification information from the external electronic device 104 or the server 106 and may provide the notification information to a user. The device management application may manage (e.g., install, uninstall or update) a function (e.g., turning on/off an external electronic device (or a component thereof) or adjusting brightness (or resolution) of a display) of at least a part of the external electronic device 104 or the server 106 that communicates with the electronic device 101, an application operated in the external electronic device, or a service (e.g., a call service or a messaging service) provided from the external electronic device.

According to an embodiment of the present invention, the application 134 may include a specified application according to an attribute (e.g., the type of an electronic device) of the external electronic device 104 or the server 106. For example, if the external electronic device is an MP3 player, the application 134 may include an application related to playback of music. For another example, if the external electronic device is a mobile medical device, the application 134 may include an application related to health care. According to an embodiment of the present invention, the application 134 may included at least one of a specified application for the electronic device 101 and an application received from the external electronic device 104 or the server 106.

According to an embodiment of the present invention, the bias look-up table 135 may provide information for amplifying a signal transmitted from the electronic device 101 to the external electronic device 104 or the server 106. For example, the electronic device 101 may enable a power amplifier (not shown) to apply a DC voltage corresponding to an appropriate bias when transmitting a signal to the external electronic device 104 or the server 106, with reference to bias values stored in the bias look-up table 135. The bias look-up table 135 may include a plurality of (e.g., n×m number of) bias values corresponding to a plurality of (e.g., n number of) channels through which the electronic device 101 transmits/receives signals and a plurality of (e.g., m number of) transmission (Tx) power levels for each channel.

The input/output interface 140 may transfer a command or data input by a user through an input/output device (e.g., a sensor, a keyboard or a touch screen) to the processor 120, the memory 130, the communication interface 160, or the bias module 170 through, for example, the bus 110. For example, the input/output interface 140 may provide, to the processor 120, data about a touch of the user on a touch screen. Furthermore, the input/output interface 140 may output, through the input/output device (e.g., a speaker or a display), for example, the command or data received from the processor 120, the memory 130, the communication interface 160, or the bias module 170 through the bus 110. For example, the input/output interface 140 may output voice data processed by the processor 120 to the user through a speaker.

The display 150 may show various information (e.g., multimedia data or text data) to the user.

The communication interface 160 may establish a communication connection between the electronic device 101 and external electronic devices (e.g., the external electronic device 104 or the server 106). For example, the communication interface 160 may be connected to a network 162 based on a wireless or wired communication technology so as to communicate with the external device. The wireless communication technology may include at least one of Wireless Fidelity (Wi-Fi), BlueTooth (BT), Near Field Communication (NFC), Global Positioning System (GPS), or cellular communication (e.g., Long Term Evolution (LTE), LTE-Advanced (LTE-A), Code Division Multiple Access (CDMA), Wideband CDMA (WCDMA), Universal Mobile Telecommunications System (UMTS), Wireless Broadband (WiBro), or Global System for Mobile communications (GSM)). The wired communication technology may include, for example, at least one of Universal Serial Bus (USB), High Definition Multimedia Interface (HDMI), Recommended Standard 232 (RS-232), or Plain Old Telephone Service (POTS).

According to an embodiment of the present invention, the network 162 may be a telecommunications network. The telecommunications network may include at least one of a computer network, the Internet, the Internet of Things (IoT), or a telephone network. According to an embodiment of the present invention, a protocol (e.g., a transport layer protocol, a data link layer protocol or a physical layer protocol) for communication between the electronic device 101 and an external electronic device may be supported by at least one of the bias look-up table 135, the application 134, the application programming interface 133, the middleware 132, the kernel 131, the communication interface 160, or the bias module 170.

The bias module 170 may store the bias values in the bias look-up table 135, or may adjust the bias values stored in the bias look-up table 135. For example, the bias module 170 may update the bias values stored in the bias look-up table 135, based on communication environment information received from a communication module (e.g., the communication interface 160). According to an embodiment of the present invention, the bias module 170 may process at least a part of information obtained from another element (e.g., the processor 120, the memory 130, the input/output interface 140, or the communication interface 160), and may provide the processed information to the communication module (e.g., the communication interface 160) in various ways. For example, the bias module 170 may obtain a specified bias value from the bias look-up table 135, and may provide the obtained bias value to a power amplifier included in the communication module.

Figure 2:
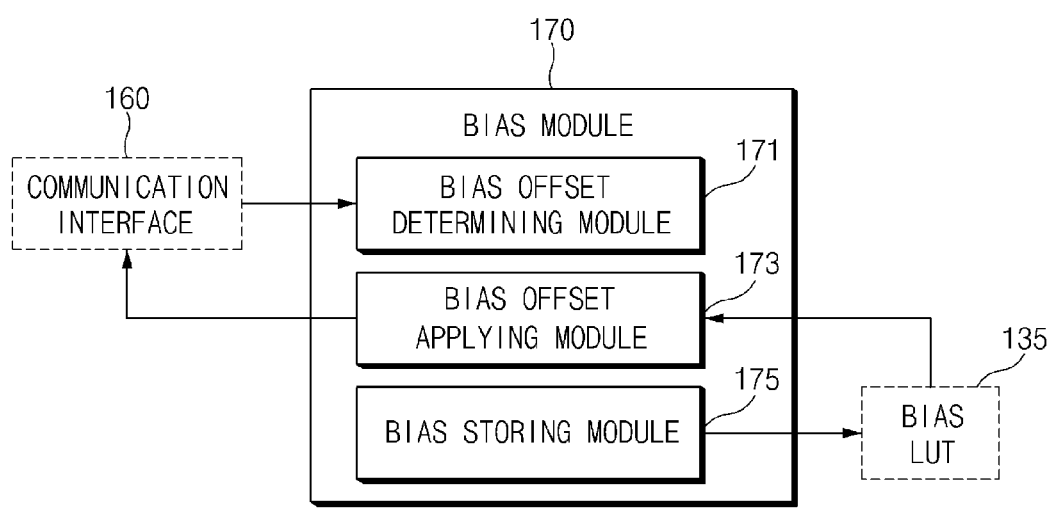
FIG. 2 is a diagram illustrating a bias module according to an embodiment of the present invention.

FIG. 2 is a diagram illustrating a bias module according to an embodiment of the present invention.

Referring to FIG. 2, a bias module 170 according to an embodiment of the present invention includes a bias offset determining module 171, a bias offset applying module 173, or a bias storing module 175.

According to an embodiment of the present invention, an electronic device (e.g., the electronic device 101) may include a communication module (e.g., the communication interface 160) and a bias module (e.g., the bias module 170). In some embodiments of the present invention, the bias module 170 may be included in the communication interface 160 so that the bias module 170 and the communication interface 160 may be implemented as a single communication module.

According to an embodiment of the present invention, the electronic device may add/subtract a bias offset determined according to a state of a reception channel to/from a bias value corresponding to a channel and transmission power so as to control a power amplifier based on a changed bias value. Furthermore, according to an embodiment of the present invention, the electronic device may prestore bias values corresponding to channels and transmission power, and, if a channel and transmission power for transmitting a signal are determined, the electronic device may control the power amplifier using a bias value corresponding to the determined channel and transmission power.

In a wireless communication environment such as Third Generation (3G) or LTE, a plurality of channels may exist in one band. For example, a Band 1 (B1) (not shown) having a center frequency of about 2100 MHz includes an uplink frequency band from about 1920 MHz to about 1980 MHz and a downlink frequency band from about 2100 MHz to about 2170 MHz. A channel bandwidth of B1 may be set to be about 20 MHz, and B1 may include at least six channels (the channel bandwidth of the band 1 may be set to be about 5, 10 or 15 MHz other than 20 MHz). The electronic device may transmit signals with various values of power for each channel. For example, the electronic device may transmit signals with a power of about 0, 10, 20, or 24 dBm for each channel. According to an embodiment of the present invention, instead of applying a uniform PA bias value to a plurality of channels of the same band, a PA bias value is changed according to each channel and transmission power level, or a prestored PA bias value is used to reduce current consumption, thereby improving reception sensitivity.

According to an embodiment of the present invention, the bias offset determining module 171 determines a bias offset to be applied to a reference bias value for an arbitrary channel among a plurality of channels included in one band. For example, the bias offset determining module 171 obtains a channel quality of the channel from the communication interface 160. The bias offset determining module 171 determines the bias offset to be applied to the reference bias value based on the obtained channel quality. For example, the bias offset determining module 171 determines a first bias offset value if the channel quality is equal to or larger than a specified threshold (e.g., if it is determined that the channel quality is not satisfactory). The first bias offset may have a positive value, in order to increase a final bias value (i.e., to improve the channel quality). The bias offset determining module 171 may determine a second bias offset value if the channel quality is less than the specified threshold (e.g., if it is determined that the channel quality is satisfactory). The second bias offset may have a negative value, in order to decrease the final bias value, but without degrading the channel quality to more than a certain degree.

The relational combination of "equal to or larger than/less than" used herein may be replaced with a relational combination of "equal to or larger than/equal to or less than", "larger than/less than", or "larger than/equal to or less than". Herein, the terms "first bias offset" and "second bias offset" are used for convenience, and do not indicate that the bias offset determining module 171 is required to determine two bias offsets. The bias offset determining module 171 determines at least one bias offset according to a communication environment and a configuration of hardware (e.g., a Radio Frequency (RF) Front End (RFFE)) of an electronic device.

According to an embodiment of the present invention, the bias offset applying module 173 may apply a bias offset (e.g., the first bias offset or the second bias offset) determined by the bias offset determining module 171 to a specified bias value (e.g., the bias value stored in the bias look-up table 135). The bias module 170 may provide the bias value to which the bias offset is applied (e.g., a primary bias) to the communication interface 160. The channel quality measurement, the bias offset determination, and the bias offset application may be performed repeatedly. For example, the bias offset may be newly applied based on the channel quality measured after the primary bias is applied.

The electronic device may control the power amplifier with the bias value to which the bias offset is newly applied (e.g., a secondary bias).

According to an embodiment of the present invention, the bias offset applying module 173 obtains a bias value corresponding to a specified channel and transmission power from the bias look-up table 135 based on the communication channel and the transmission power. The bias offset applying module 173 provides the obtained bias value to the communication interface 160. The bias value may be a numerical value calibrated, in advance, at the time of manufacturing or designing the communication module or the electronic device. According to an embodiment of the present invention, the bias value may be trained and optimized according to use of the electronic device.

According to an embodiment of the present invention, the bias storing module 175 stores a bias value in the bias look-up table 135. According to an embodiment of the present invention, the bias look-up table 135 may be located in an additional storage space (e.g., the memory 130) outside the bias module 170, or may be included in the bias module 170 or the bias storing module 175. According to an embodiment of the present invention, the processor 120 may perform operations or functions of the bias module 170 by using commands stored in the memory 130. If the processor performs operations or functions of the bias module 170, the bias look-up table 135 may be stored in the memory 130. Referring back to FIG. 2, the bias storing module 175 may store, in the bias look-up table 135, PA bias values calibrated in advance for various values of transmission power and various channels included in one band. This calibration operation is described in detail with reference to FIGS. 8 and 9.

According to an embodiment of the present invention, the bias storage module 175 may store, in the bias look-up table 135, bias values determined based on a measured channel quality or optimized through repeated calibration. Furthermore, the bias storage module 175 may update or delete the bias values stored in the bias look-up table 135 or may add bias values thereto.

Figure 3:
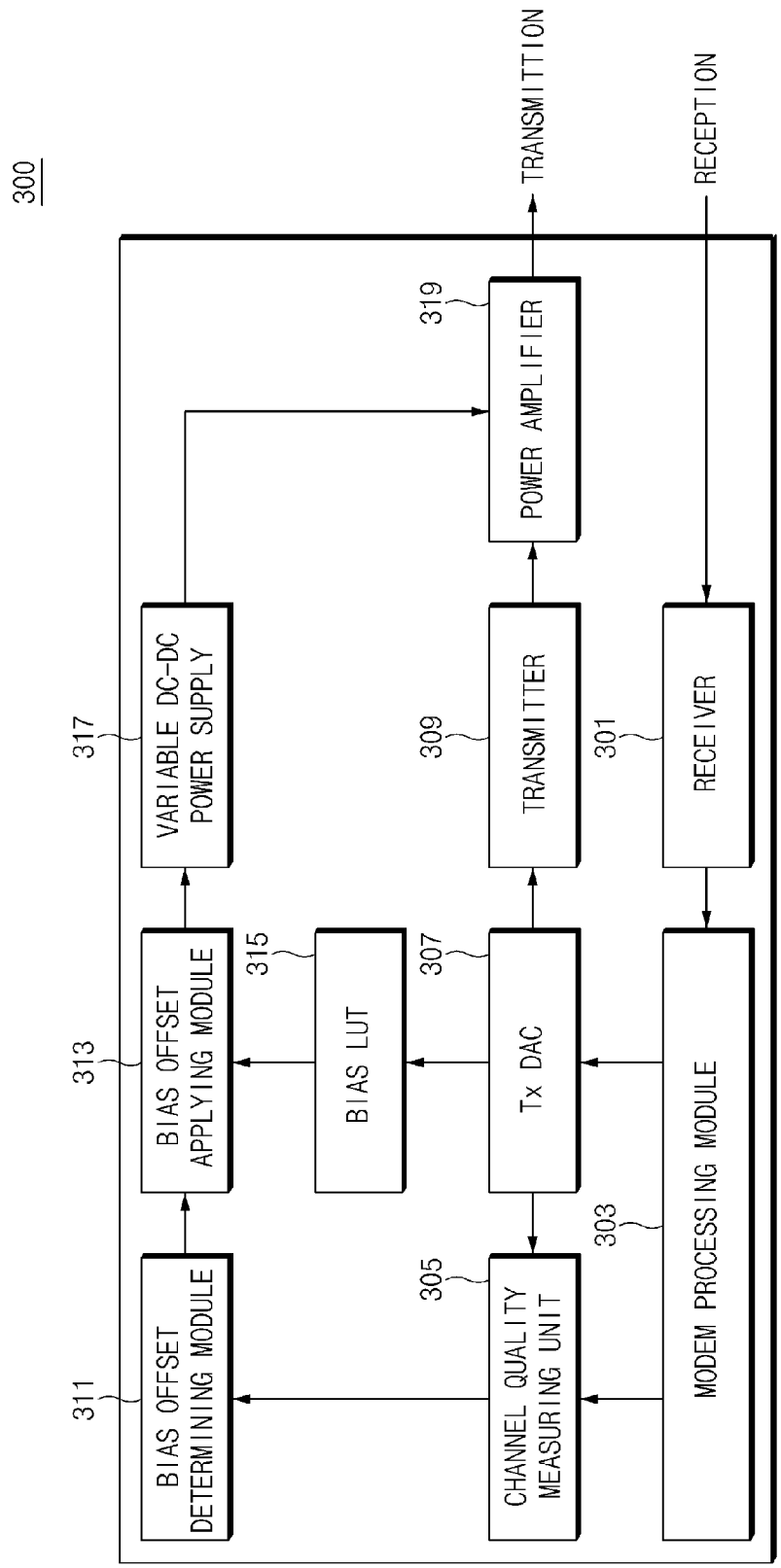
FIG. 3 is a diagram illustrating an electronic device for controlling a bias according to an embodiment of the present invention.

FIG. 3 is a diagram illustrating an electronic device for controlling a bias according to an embodiment of the present invention.

Referring to FIG. 3, an electronic device 300 (e.g., the electronic device 101) according to an embodiment of the present invention includes a receiver 301, a modem processing module 303, a channel quality measuring module 305, a Transmitting-side Digital-to-Analog Converter (Tx DAC) 307, a transmitter 309, a bias offset determining module 311 (e.g., the bias offset determining module 171), a bias offset applying module 313 (e.g., the bias offset applying module 173), a bias LUT 315 (e.g., the bias look-up table 135), a variable DC-DC power supply 317, and a power amplifier 319. Further descriptions of elements and/or operations that are similar to those already described herein above may be omitted for clarity and conciseness.

According to an embodiment of the present invention, the receiver 301 may receive a signal of a specified frequency band through an antenna. Furthermore, the receiver 301 may receive power control information or scheduling information provided from a base station or a network through a control channel.

According to an embodiment of the present invention, the modem processing module 303 may process the received signal or information through a filter (e.g., a Band Pass Filter (BPF), an image frequency rejection filter, or the like) or an amplifier (e.g., a Low Noise Amplifier (LNA) or the like). The modem processing module 303 may provide, to the channel quality measuring module 305, information for determining sensitivity of the received signal. Furthermore, the modem processing module 303 may provide the power control information or the like to the Tx DAC 307.

According to an embodiment of the present invention, the channel quality measuring module 305 may measure the channel quality of a received signal. The channel quality may be determined based on, for example, at least one of a BLock Error Rate (BLER), a Bit Error Rate (BER), a Frame Error Rate (FER), a transmission (Tx) power level, Reference Signal Received Power (RSRP), Received Signal Code Power (RSCP), Chip Energy/Others Interference (Ec/Io), a Resource Block (RB) number, or an RB position.

The channel quality measuring module 305 may divide a frequency band at a regular interval according to a characteristic of each channel, and may measure the channel quality if handover occurs. For example, the channel quality measuring module 305 may divide the band 1 of WCDMA by a bandwidth of 20 MHz into six channels, and may measure any one of the six channels if handover to the one of the six channels occurs.

According to an embodiment of the present invention, the transmitting-side digital-to-analog converter, i.e., the Tx DAC 307, may determine transmission power based on the power control information or the scheduling information. The Tx DAC 307 may provide information on the determined transmission power to at least one of the channel quality measuring module 305, the bias LUT 315, or the transmitter 309. According to an embodiment of the present invention, the channel quality measuring module 305 may determine a transmission power level determined based on the information provided from the Tx DAC 307 as the channel quality. Furthermore, the bias LUT 315 may provide, to the bias offset applying module 313, a bias value corresponding to the information provided from the Tx DAC 307. Furthermore, the transmitter 309 may determine transmission power for a transmission signal based on the information provided from the Tx DAC 307.

According to an embodiment of the present invention, the bias offset determining module 311 may determine a bias offset based on the channel quality measured by the channel quality measuring module 305. For example, if an index (e.g., a BLER or the like) that indicates the channel quality is equal to or larger than a threshold, i.e., if the channel quality is poor, the bias offset determining module 311 may determine the bias offset so that a certain PA bias offset value is added to a current PA bias value (e.g., a bias value stored in the bias LUT which corresponds to the information provided from the Tx DAC 307). According to an embodiment of the present invention, the threshold may be differently set for each channel. According to an embodiment of the present invention, if the index that indicates the channel quality is equal to or less than the threshold, i.e., if the channel quality is satisfactory, the bias offset determining module 311 may determine the bias offset so that a certain bias value is subtracted from a current PA bias value. According to an embodiment of the present invention, the bias offset may be determined in consideration of a difference in a PA gain characteristic between transmission (Tx) power level indices or an inner loop power control characteristic of WCDMA. For example, the bias offset may be determined as about +0.1 v, +0.2 v, +0.4 v, or 0. If the bias offset is 0, the bias offset is applied to a current bias value so that a modified bias value is equal to an initial (or current) bias value.

According to an embodiment of the present invention, the bias offset applying module 313 may apply the bias offset determined by the bias offset determining module 311 to a bias value stored in the bias LUT 315. The bias value to which the bias offset value is applied (e.g., the primary bias) may be provided to the variable DC-DC power supply 317, and the variable DC-DC power supply 317 may apply a voltage PA Vcc to the power amplifier 319 based on the bias.

Figure 4:
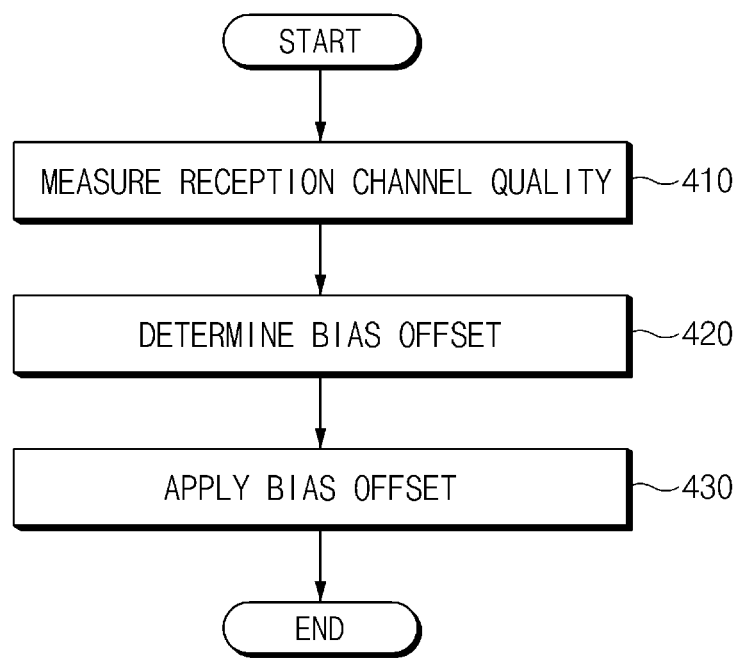
FIG. 4 is a diagram illustrating a bias control process according to an embodiment of the present invention.

FIG. 4 is a diagram illustrating a bias control process according to an embodiment of the present invention.

Referring to FIG. 4, an electronic device (e.g., the electronic device 101 or the electronic device 300) measures a quality of a reception channel in operation 410. According to an embodiment of the present invention, the electronic device may measure the channel quality if a specified event (e.g., handover occurrence, elapse of a predetermined time after latest measurement, or transmission power change) occurs. The channel quality may be measured using an index such as the transmission (Tx) power level, RSRP, RSCP or Ec/Io.

In operation 420, the electronic device determines a bias offset based on the measured channel quality. If the channel quality is relatively satisfactory, the electronic device may set a negative bias offset so that a PA bias value is reduced by a small amount, or may maintain the PA bias value (e.g., the bias offset=0). If the channel quality is relatively poor, the electronic device may set a positive bias offset so that the PA bias value is increased.

In operation 430, the electronic device applies the bias offset determined in operation 420 to a specified bias value. For example, the electronic device may apply the bias offset determined in operation 420 to a bias value stored in the bias look-up table 135 based on an ACLR measurement value or a prestored bias value to which a bias offset has been applied at least once. The power amplifier may amplify transmission power using the bias value to which the bias offset is applied as an input voltage Vcc. A specific application example is described herein below with reference to FIG. 5.

Figure 5:
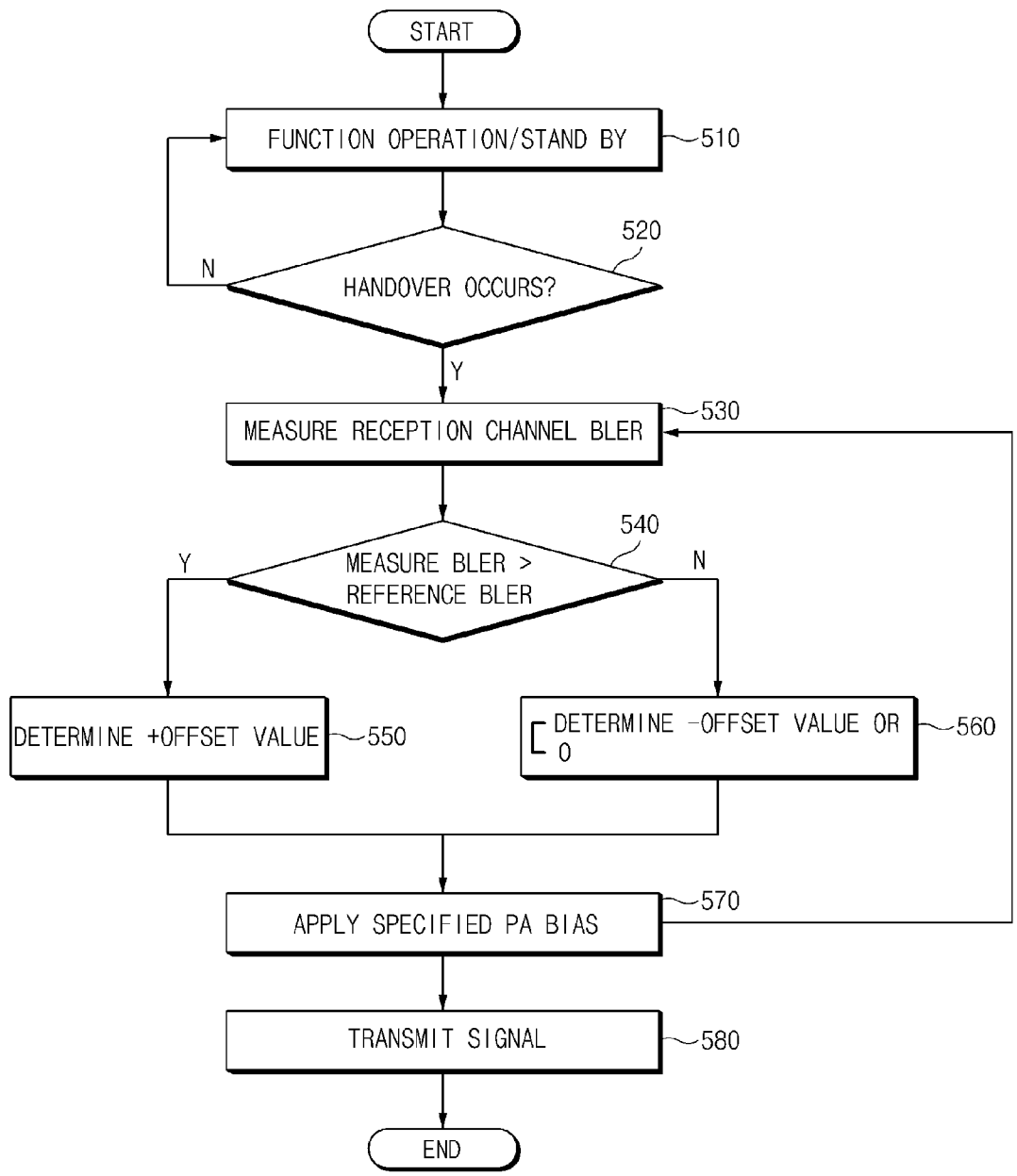
FIG. 5 is a diagram illustrating a bias control method based on a BLER according to an embodiment of the present invention.

FIG. 5 is a diagram illustrating a bias control method based on a BLER according to an embodiment of the present invention.

Referring to FIG. 5, an electronic device (e.g., the electronic device 101 or the electronic device 300) performs operates a specified function, or operates in a stand\-by mode, in operation 510. For example, the electronic device may transmit or receive data, or may make a call to another user terminal. The electronic device may be in a sleep state while maintaining a connection to a base station.

In operation 520, the electronic device (e.g., the modem processing module 303) determines whether handover (or hand off) occurs. For example, the electronic device may determine whether handover occurs with respect to a WCDMA download channel 10714CH. The process proceeds to operation 530 if the handover occurs. Otherwise, the process returns to operation 510. However, according to an embodiment of the present invention, the electronic device performs operation 530 in response to occurrence of an event other than the handover.

In operation 530, the electronic device (e.g., the channel quality measuring module 305) measures the BLER of a reception channel. According to an embodiment of the present invention, the electronic device may measure the BLER if a Received Signal Strength Indication (RSSI) satisfies a specified condition. For example, the electronic device may measure the BLER if it is moved to a weak electric field area (e.g., an area in which the RSSI is about −108 dBm) in electric field conditions in which the RSSI is changed.

In operation 540, the electronic device (e.g., the bias offset determining module 311) may compare the measured BLER with a specified ratio (e.g., a reference BLER). If the measured BLER value is greater than the reference BLER value, the electronic device may determine that the bias offset should have a positive value in operation 550. For example, if the reference BLER is about 0.1%, the electronic device may set the bias offset to about +0.2 V, so that a current PA bias value is increased by about 0.2 V if the measured BLER is equal to or larger than about 0.1%. If the measured BLER value is less than the reference BLER value, the electronic device determines that the bias offset should have a negative value, or sets the bias offset as 0, so that the current PA bias value is maintained, in operation 560. For example, if the measured BLER is less than about 0.1%, the electronic device may set the bias offset to about −0.1 V so that the current PA bias value is reduced by about 0.1 V.

In operation 570, the electronic device (e.g., the bias offset applying module 313) applies the bias offset determined in operation 550 or 560 to a specified PA bias. According to an embodiment of the present invention, the specified PA bias may be stored in the bias look-up table 315 in advance.

In operation 580, the electronic device transmits a signal by amplifying transmission power according to a bias voltage to which the bias offset has been applied in operation 570.

According to an embodiment of the present invention, operations 530 to 570 may be performed repeatedly. For example, the electronic device may perform operations 530 to 570 again if a certain time elapses or handover occurs while the electronic device transmits signals in operation 580 using the bias to which the bias offset has been applied in operation 570 (e.g., the primary bias). In the above-described example, the electronic device may check the BLER of a reception channel in the same area where the RSSI is about −108 dBm. In this case, if the measured BLER is equal to or larger than about 0.1%, the electronic device may further increase the PA bias by about 0.2 V (bias offset=about +0.2 V). Alternatively, if the measured BLER is less than about 0.1%, the electronic device may further decrease the PA bias by about 0.1 V (bias offset=about −0.1 V). The above-described process may be repeated a predetermined number of times. In the above-described example, the electronic device may determine a bias value determined by repeating operations 530 to 570 twice (e.g., a secondary bias) as a final bias value for a channel 10713CH, and may allow the power amplifier to be operated based on the final bias value.

TABLE 1

| Default PA bias | | | BLER | >0.1% | <0.1% | | BLER | >0.1% | =0.1% | <0.1% |
|---|---|---|---|---|---|---|---|---|---|---|
| Tx level | 10713CH | | Tx level | 10713CH | 10713CH | | Tx level | 10713CH | 10713CH | 10713CH |
| 24 dBm | 3.0 V | BLER | 24 dBm | 3.2 V | 2.9 V | BLER | 24 dBm | 3.4 V | 3.1 V | 2.8 V |
| 20 dBm | 2.6 V | @RSSI: | 20 dBm | 2.8 V | 2.5 V | @RSSI: | 20 dBm | 3.0 V | 2.7 V | 2.4 V |
| 10 dBm | 1.2 V | −108 dBm | 10 dBm | 1.4 V | 1.1 V | −108 dBm | 10 dBm | 1.6 V | 1.3 V | 1.0 V |
| 0 dBm | 1.0 V | → Primary | 0 dBm | 1.2 V | 1.0 V | → Secondary | 0 dBm | 1.4 V | 1.1 V | 1.0 V |

Table 1 shows a change of a bias value for a channel 10713CH according to the process of FIG. 5. A default PA bias may be a value predetermined at the time of initial calibration or product design. Regarding when a transmission power level (Tx level) is about 24 dBm, if the BLER primarily measured is greater than about 0.1%, about 3.2 V obtained by increasing the default PA bias (about 3.0 V) by about 0.2 V (bias offset=about +0.2 V) may be a primary bias. If the measured BLER is less than about 0.1%, about 2.9 V obtained by decreasing the default PA bias by about 0.1 V (bias offset=about −0.1 V) may be the primary bias. If the BLER additionally (secondarily) measured is greater than about 0.1%, the electronic device may add about +0.2 V to the primary bias (3.2 V) so as to determine about 3.4 V as a secondary bias. If the BLER additionally measured is less than about 0.1%, the electronic device may reduce the primary bias (3.2 V) by about 0.1 V so as to determine about 3.1 V as the secondary bias (the same result may be obtained if the BLER primarily measured is less than about 1% and the BLER secondarily measured is larger than about 1%). If both the BLERs primarily and secondarily measured are less than about 0.1% (i.e., if the channel quality is excellent), the electronic device may determine the secondary bias as about 2.8 V. In this manner, the electronic device may determine the PA bias value for various values of transmission power for the channel 10713CH. The above-described method may be applied to various bands and various channels.

Referring to Table 1, a maximum value of the PA bias may be designed so that the same voltage amplifier hardware performance (e.g., the ACLR or transmission power) is assured, even when a voltage amplifier input voltage PA Vcc (about 3.4 V) is determined in consideration of a voltage drop (about 0.1 V) due to a wiring under a low-voltage battery condition (about 3.5 V). Furthermore, the maximum value of the PA bias may be set to be about 3.7 V in a PA bias mode, or in a bypass mode in which the battery power supply is applied to the input voltage PA Vcc. A minimum value of the PA bias may be set to be about 1.0 V in consideration of a margin of about 0.1-0.2 V for a minimum value (about 0.5-0.7 V) for satisfying basic hardware performance of the voltage amplifier. However, according to an embodiment of the present invention, various voltage values may be set as the maximum value or the minimum value.

According to an embodiment of the present invention, the channel quality may be measured using a transmission power level. For example, due to a hardware design of an RFFE, a phenomenon of leakage of a transmission signal is relatively significant with respect to a channel 10838CH, and thus the signal reception sensitivity of an adjacent channel (e.g., a download channel based on Frequency Division Duplex (FDD)) may be degraded. For example, when the transmission power is increased to at least about 15 dBm, for a channel (e.g., the channel 10838CH) in which a reception sensitivity reduction phenomenon occurs due to ACLR characteristic degradation, the electronic device may use a transmission power level of the channel to determine the channel quality.

Regarding the above-described example in which the transmission power level is as the channel quality, the BLER used in the process of FIG. 5 may be replaced with the transmission power level. For example, handover to an arbitrary channel (e.g., the channel 10838CH) may occur in operation 520, and the electronic device may check the transmission power level for a location in which the electronic device is currently positioned in operation 530. Information on transmission power may be included in power control information received through an antenna of the electronic device. For example, regarding the example illustrated in FIG. 3, the Tx DAC 307 may provide the information on the transmission power included in the power control information to the channel quality measuring module 305.

In operation 540, it may be determined whether the transmission power level is equal to or larger than a reference value (specified transmission power (e.g., about 15 dBm)). A positive bias offset may be determined in operation 550 if the transmission power level is equal to or larger than the reference value, otherwise a bias offset of 0 may be determined. For example, if the transmission power is equal to or larger than about 15 dBm, a bias offset of about +0.4 V may be applied to a current PA bias, or, if the transmission power is less than about 15 dBm, the current PA bias may be directly used (bias offset=0). Table 2 shows a result according to the transmission power level for the channel 10838CH.

TABLE 2

| Default PA bias | | | Calibrated PA bias | |
|---|---|---|---|---|
| Tx level | 10838CH | | Tx level | 10838CH |
| 24 dBm | 3.0 V | Tx level check | 24 dBm | 3.4 V |
| 20 dBm | 2.6 V | → | 20 dBm | 3.0 V |
| 10 dBm | 1.2 V | | 10 dBm | 1.2 V |
| 0 dBm | 1.0 V | | 0 dBm | 1.0 V |

Referring to Table 2, since the PA bias value for initial transmission power is set to be up to about 25 dBm, and maximum transmission power for WCDMA is about 24 dBm, the transmission power may be set to be about 25 dBm or less in consideration of a margin. According to an embodiment of the present invention, the range of the transmission power may be variously set based on maximum transmission power provided by a communication environment and an initial set value of a PA bias.

TABLE 3

| Tx level | 10562CH | 10664CH | 10700CH | 10735CH | 10838CH | | 10838CH |
|---|---|---|---|---|---|---|---|
| 24 dBm | 3.3 V | 3.1 V | 3.1 V | 3.1 V | 3.7 V | or Same as left | 3.3 V |
| 20 dBm | 3.0 V | 2.8 V | 2.8 V | 2.8 V | 3.4 V | | 3.0 V |
| 15 dBm | 2.2 V | 2.0 V | 2.0 V | 2.0 V | 2.5 V | | 2.2 V |
| 10 dBm | 1.7 V | 1.5 V | 1.5 V | 1.5 V | 1.7 V | | 1.7 V |
| 5 dBm | 1.3 V | 1.1 V | 1.1 V | 1.1 V | 1.3 V | | 1.3 V |
| 0 dBm | 1.0 V | 1.0 V | 1.0 V | 1.0 V | 1.0 V | | 1.0 V |

Table 3 shows a PA bias table that may be obtained by applying a bias offset according to the method of FIG. 5. Such a PA bias table may be stored in the bias look-up table 315 in the form of a data structure.

In a typical WCDMA, High-Speed Downlink Packet Access (HSDPA), or High-Speed Uplink Packet Access (HSUPA) environment, reception sensitivity degradation (desensitization) may become significant at a transmission power of about 15 dBm or more with respect to a channel having a relatively high frequency among the communication channels shown in Table 3, and a channel of an intermediate frequency band may be designed to have an ACLR margin that is greater than that of a channel having a relatively low frequency by as much as about 2-3 dB. Therefore, a plurality of channels may be classified based on a frequency so that a bias or a bias offset to be applied to each of classified channels may be differently determined. For example, if the channels are classified into low, middle and high channels based on channels 10600CH and 10800CH, the bias table shown in Table 3 may be obtained. Referring to Table 3, the same bias value may be applied according to transmission power for the channels 10664CH, 10700CH and 10735CH classified as the middle channel. Since the ACLR and reception sensitivity characteristics are relatively excellent in the middle channel, a lowest PA bias value is applied, as a result of applying a bias offset in comparison with the low or high channel, so that current consumption of the electronic device may be reduced. By contrast, in the high channel (e.g., the channel 10838CH), a desensitization phenomenon becomes more significant at a transmission power of about 15 dBm or more and the ACLR margin is not sufficient. Therefore, a greater PA bias value may be applied to the high channel in comparison with the low or middle channel. However, according to an embodiment of the present invention, if a channel state (e.g., the channel quality) is satisfactory, the high channel may be operated with the same PA bias value as that of the low channel (e.g., the channel 10562CH) as shown in the right-side data of Table 3.

Figure 6:
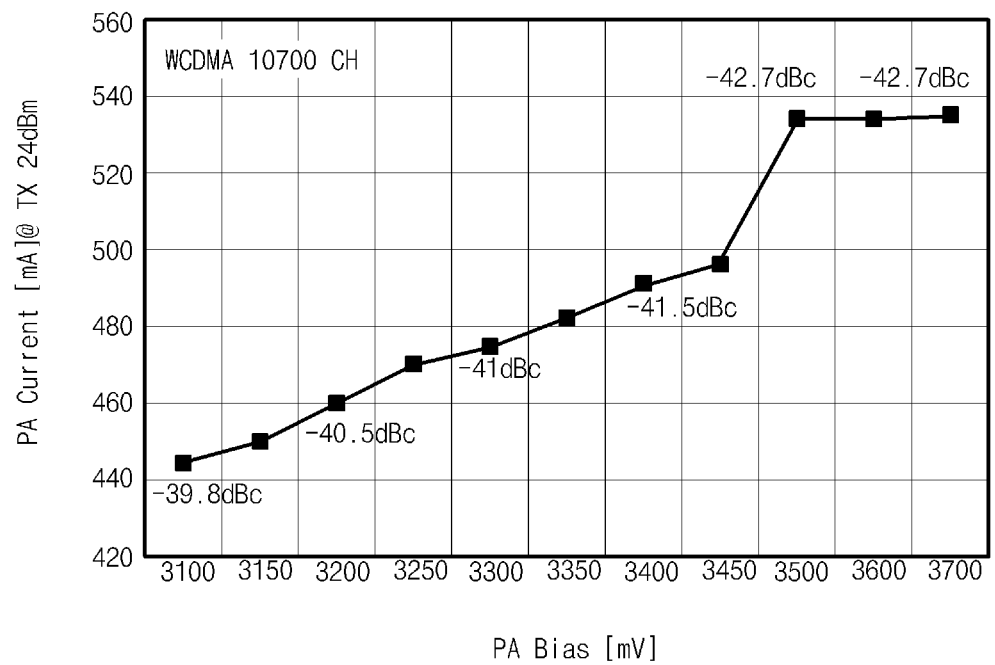
FIG. 6 is a diagram illustrating a change of current consumption of an electronic device according to an embodiment of the present invention.

FIG. 6 is a diagram illustrating a change of current consumption of an electronic device according to an embodiment of the present invention.

In detail, FIG. 6 is a diagram illustrating a change of current consumption according to a PA bias value with respect to the WCDMA downlink channel 10700CH. As the PA bias value is decreased, the ACLR performance degrades, but current consumption of a power amplifier may be linearly reduced. For example, the electronic device may determine the PA bias value within a range satisfying about −40 dBc, in consideration of an ACLR margin of about 7 dB. In the present example, the PA bias value is reduced to about 3.1 V, and the current consumption is about 445 mA at the PA bias value of 3.1 V. The reduction of the PA bias value may cause current consumption reduction of up to about 90 mA in comparison with the case where the PA bias is about 3.7 V (current consumption is about 535 mA) or the case where the PA bias is about 3.4 V (current consumption is about 495 mA).

Figure 7:
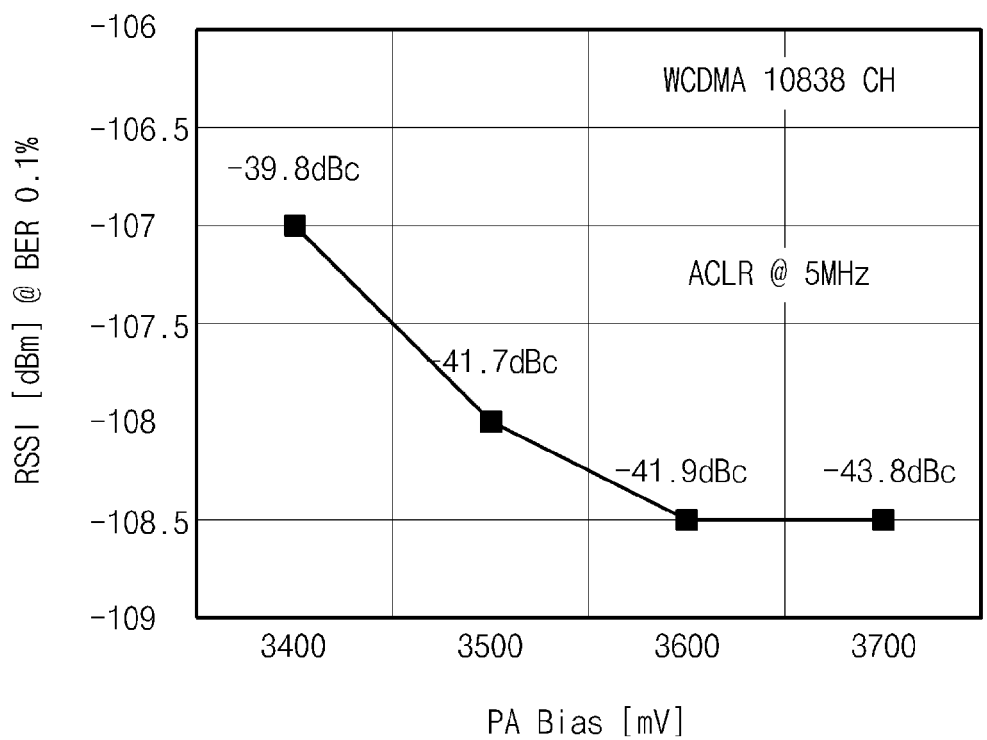
FIG. 7 is a diagram illustrating a change of reception sensitivity of an electronic device according to an embodiment of the present invention.

FIG. 7 is a diagram illustrating a change of reception sensitivity of an electronic device according to an embodiment of the present invention.

Referring to FIG. 7, as the PA bias value is increased, linearity of a power amplifier increases and a leakage component of a transmission signal of a reception frequency band decreases, so that the desensitization phenomenon is reduced. The electronic device may determine the PA bias value within a range satisfying about −40 dBc in consideration of an ACLR margin of about 7 dB, as described above with reference to FIG. 6. If the electronic device increases the PA bias value, the reception sensitivity may be improved since an RSSI value measured when the BER (or BLER) is about 0.1% is reduced (from about −107 to about −108.5). As shown in FIG. 7, the reception sensitivity is improved by as much as about 1.5 dBm if the PA bias value is increased from about 3.4 V to about 3.6 V for the WCDMA downlink channel 10838CH.

A bias control method of an electronic device according to an embodiment of the present invention may include measuring a channel quality of a received signal, determining a bias offset based on the measured channel quality, applying the determined bias offset to a specified bias value, and amplifying transmission power according to the bias value to which the bias offset is applied.

According to an embodiment of the present invention, a bias control method is performed when handover occurs.

According to an embodiment of the present invention, the measurement of the channel quality is performed at a specified range of an RSSI.

According to an embodiment of the present invention, the application of the determined bias offset to the specified bias value is performed on a bias for transmission power and a channel corresponding to the measured channel quality.

Methods for storing a PA bias value appropriately set according to a communication environment such as a channel and transmission power in an electronic device and for transmitting a signal using the PA bias value are described herein below with reference to FIGS. 8 to 10. The configurations or effects described above with reference to Embodiments of the present invention corresponding to FIGS. 1 to 7 may be applied to the following description with reference to FIGS. 8 to 10.

Figure 8:
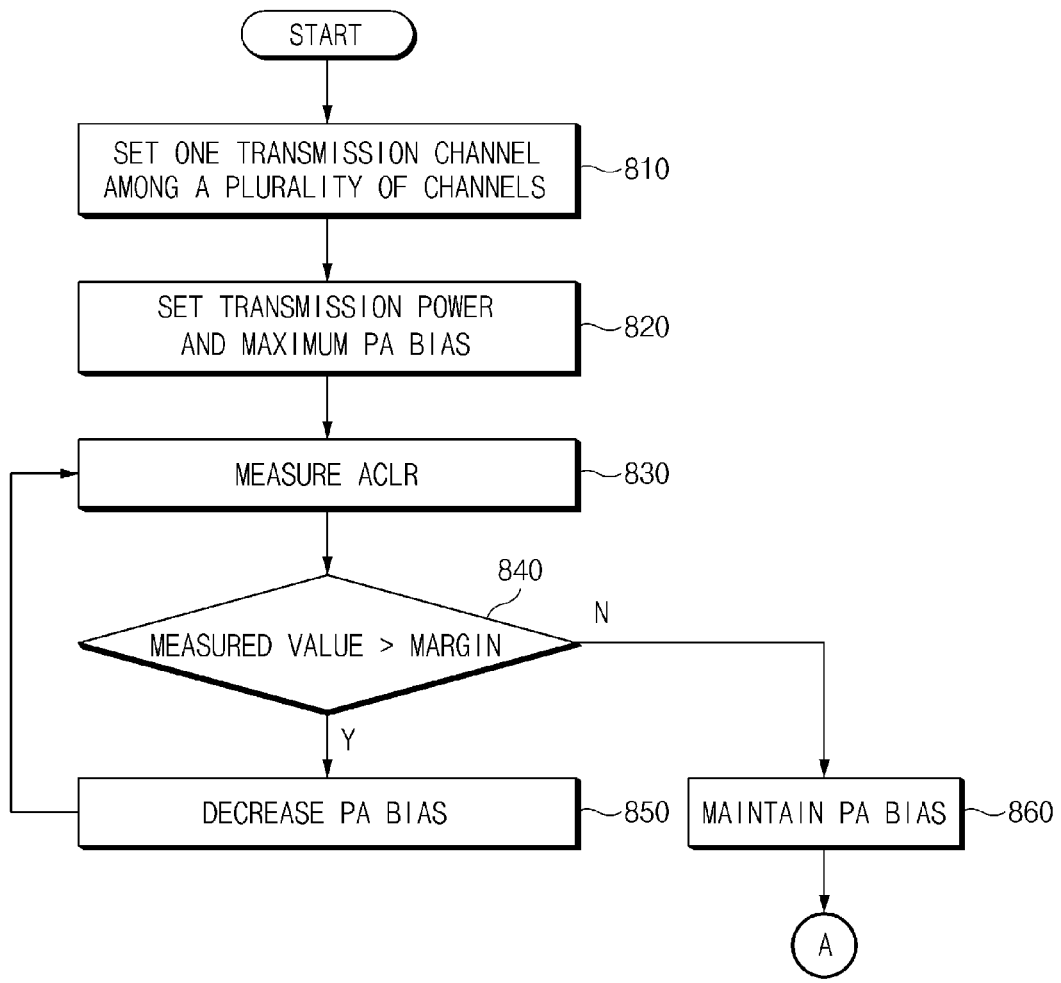
FIG. 8 is a diagram illustrating a method for setting a PA bias based on ACLR measurement according to an embodiment of the present invention.

FIG. 8 is a diagram illustrating a method for setting a PA bias based on ACLR measurement according to an embodiment of the present invention.

Referring to FIG. 8, an electronic device (e.g., the electronic device 101 or the electronic device 300) divides a frequency band at a regular interval into a plurality of channels according to a characteristic of each channel, and may set one of the plurality of channels in operation 810. In operation 820, the electronic device sets transmission power (e.g., maximum transmission power, 24 dBm, or the like) for the set channel, and also sets a maximum PA bias.

In operation 830, the electronic device measures an ACLR as an index that indicates linearity of a power amplifier. For example, the electronic device may calculate a difference in power between a center channel and a position (e.g., a channel) spaced apart therefrom by a specified offset (frequency), in units of dBc.

In operation 840, the electronic device compares a measured ACLR value with a reference margin value. For example, if the measured ACLR value is greater than the reference margin value, the PA bias may be calibrated to a lower value since the linearity is sufficiently satisfactory. Once the PA bias is calibrated, the process returns to operation 830 so that the ACLR may be measured.

Operations 830 to 850 are repeated until the measured ACLR value becomes less than or equal to the reference margin value. If the measured ACLR value is less than or equal to the reference margin value, the process proceeds to operation 860 so that the PA bias value most recently calibrated to a lower value may be maintained, and the process may proceed to operation 910 of FIG. 9. The following process will be described with reference to FIG. 9.

Figure 9:
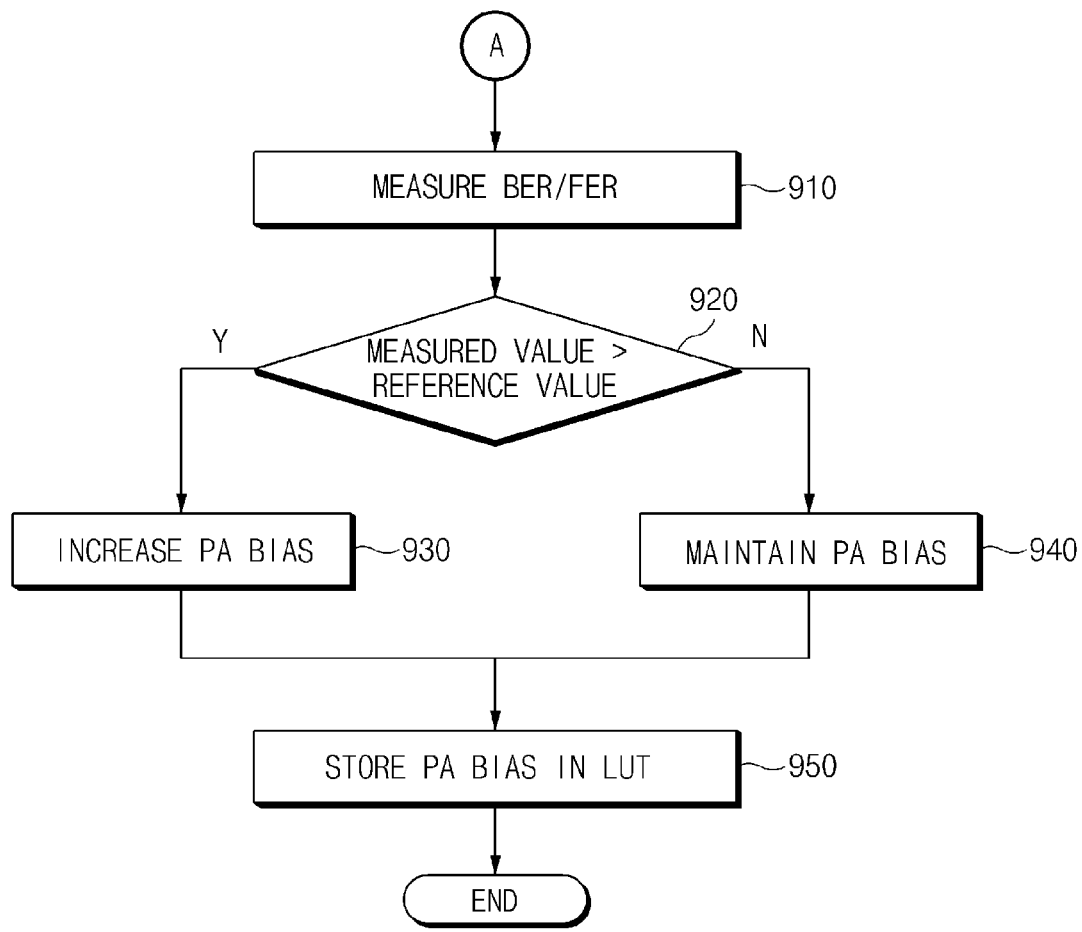
FIG. 9 is a diagram illustrating a method for storing a PA bias in a bias look-up table according to an embodiment of the present invention.

FIG. 9 is a diagram illustrating a method for storing a PA bias in a bias look-up table according to an embodiment of the present invention.

The process of FIG. 9 is performed following operation 860 of FIG. 8. In operation 910, the electronic device checks a BER or FER. The electronic device may check the BER or FER when a specified event occurs, for example, when a terminal enters an online mode or is in an RSSI state (e.g., low RSSI) that allows reception sensitivity measurement. The following description is provided based on the BER.

In operation 920, the electronic device compares the measured BER with a reference BER (or a threshold BER). The reference BER may be differently set for each channel. If the measured BER is greater than a reference value (e.g., about 0.1%), the electronic device may increase the PA bias value (e.g., the bias value maintained in operation 860) in operation 930. Since the PA bias value is increased, the BER may be improved. If the measured BER is lower than the reference value, the electronic device maintains the PA bias value (e.g., the bias value maintained in operation 860) in operation 940. In operation 950, the electronic device (e.g., the bias storing module 175) stores the PA bias in the bias LUT (e.g., the bias look-up table 135 or the bias LUT 315).

According to an embodiment of the present invention, the electronic device may adjust the PA bias value using the transmission power level. For example, regarding the channel 10838CH, the leakage phenomenon of a transmission signal may be serious, causing degradation of the reception sensitivity of an adjacent channel. Regarding the example of adjusting the PA bias using the transmission power level, the BER used in the process of FIG. 9 may be replaced with the transmission power level. For example, in operation 910, the electronic device may check the transmission power when the terminal enters the online mode. For example, if the transmission power falls within a specified range (e.g., about 15-25 dBm), in operation 920, the electronic device increases a current PA bias value (e.g., the bias value maintained in operation 860), in operation 930, and stores the increased PA bias value in the bias look-up table, in operation 950. If the transmission power is outside the specified range, the electronic device maintains a previously set PA bias value (e.g., the bias value maintained in operation 860), in operation 940, and then stores the maintained bias value in the bias look-up table, in operation 950.

Figure 10:
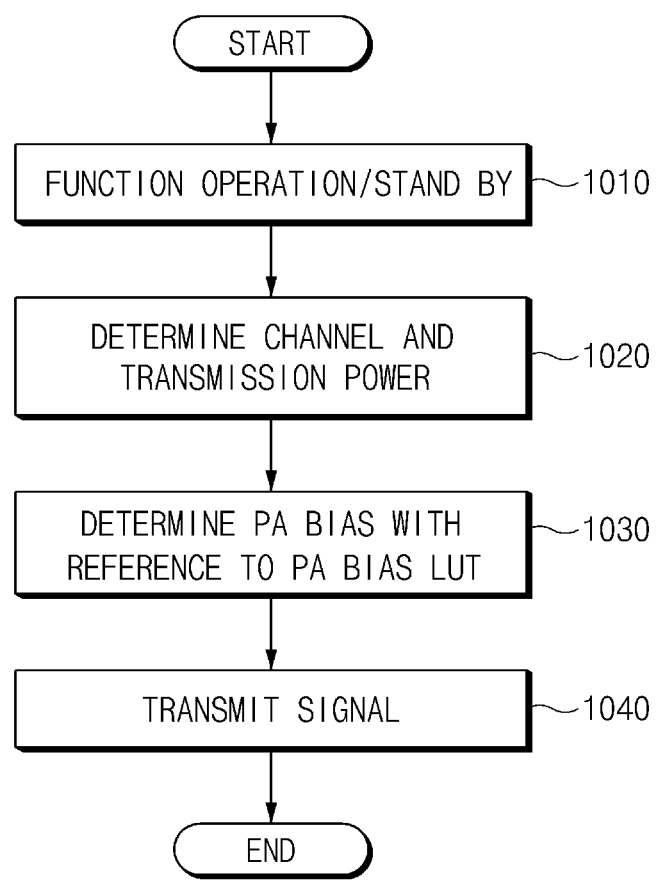
FIG. 10 is a diagram illustrating a method for determining a PA bias with reference to a bias look-up table according to an embodiment of the present invention.

FIG. 10 is a diagram illustrating a method for determining a PA bias with reference to a bias look-up table according to an embodiment of the present invention.

Referring to FIG. 10, an electronic device (e.g., the electronic device 101 or the electronic device 300) performs or operates a specified function, or operates in a stand-by mode, in operation 1010. For example, the electronic device may transmit or receive data, or may make a call to another user terminal. The electronic device may be in a sleep state while maintaining a connection to a base station.

In operation 1020, the electronic device determines a transmission power and a channel currently used for transmitting a signal. For example, the electronic device may determine that the channel currently used for transmitting a signal is the channel 10838CH of the band 1 of a WCDMA environment and the transmission power is about 24 dBm.

In operation 1030, the electronic device determines a PA bias to be provided to a power amplifier based on the channel and the transmission power with reference to a PA bias LUT (e.g., the bias look-up table 135 or the bias LUT 315). Here, the PA bias LUT may include PA bias values determined based on the transmission power level or the channel quality such as the BER or FER for each channel and transmission power using the methods of FIGS. 8 and 9.

In operation 1040, the electronic device amplifies the transmission power based on the PA bias to transmit a signal to a network.

Figure 11:
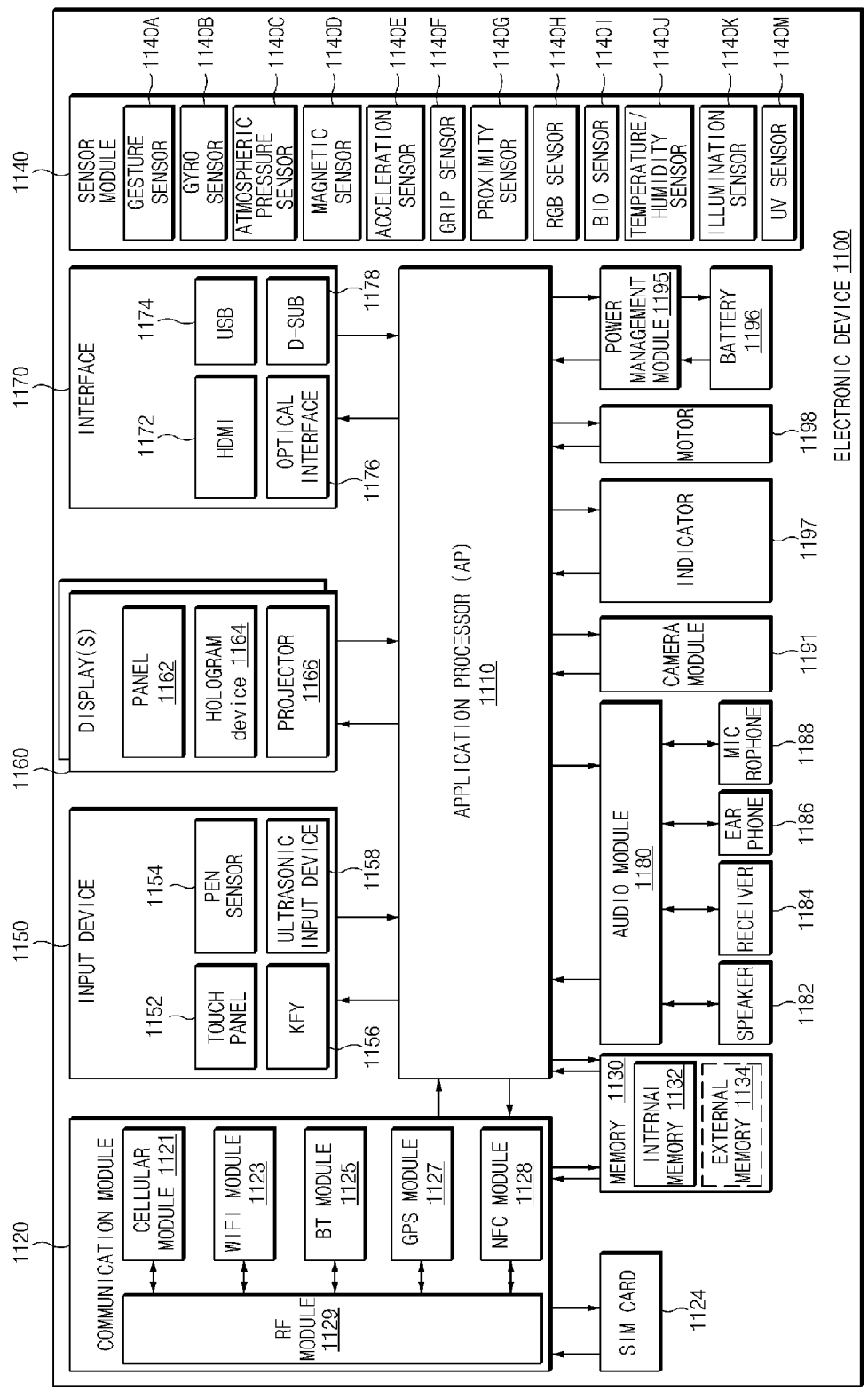
FIG. 11 is a block diagram illustrating a hardware structure of an electronic device according to an embodiment of the present invention.

FIG. 11 is a block diagram illustrating a hardware structure of an electronic device according to an embodiment of the present invention.

An electronic device 1100 may constitute, for example, a part or the entirety of the electronic device 101 illustrated in FIG. 1. Referring to FIG. 11, the electronic device 1100 includes at least one of at least one application processor (AP) 1110, a communication module 1120, a Subscriber Identification Module (SIM) card 1124, a memory 1130, a sensor module 1140, an input device 1150, a display module 1160, an interface 1170, an audio module 1180, a camera module 1191, a power management module 1195, a battery 1196, an indicator 1197, or a motor 1198.

The AP 1110 (e.g., the processor 120) may control a plurality of hardware or software elements connected to the AP 1110 by running an operating system or an application program, and may process various data including multimedia data and may perform an operation. The AP 1110 may be implemented with, for example, a System on Chip (SoC). According to an embodiment of the present invention, the AP 1110 may further include a Graphics Processing Unit (GPU).

The communication module 1120 (e.g., the communication interface 160) may perform data transmission/reception for communication between the electronic device 1100 (e.g., the electronic device 101) and another electronic device (e.g., the external electronic device 104 or the server 106) connected thereto through a network. According to an embodiment of the present invention, the communication module 1120 may include a cellular module 1121, a Wi-Fi module 1123, a BT module 1125, a GPS module 1127, an NFC module 1128, and an RF module 1129.

The cellular module 1121 may provide a voice call service, a video call service, a text message service, or an Internet service through a telecommunications network (e.g., an LTE, LTE-A, CDMA, WCDMA, UMTS, WiBro or GSM network). Furthermore, the cellular module 1121 may identify and authenticate electronic devices in the telecommunications network using, for example, the SIM card 1124. According to an embodiment of the present invention, the cellular module 1121 may perform at least a part of functions provided by the AP 1110. For example, the cellular module 1121 may perform at least a part of a multimedia control function.

According to an embodiment of the present invention, the cellular module 1121 may include a communication processor (CP). The cellular module 1121 may be implemented with, for example, an SoC. Although FIG. 11 illustrates that the cellular module 1121 (e.g., a CP), the memory 1130 and the power management module 1195 are separated from the AP 1110, the AP 1110 may include at least a part of the foregoing elements (e.g., the cellular module 1121), according to an embodiment of the present invention.

According to an embodiment of the present invention, the AP 1110 or the cellular module 1121 (e.g., a CP) may load, on a volatile memory, a command or data received from nonvolatile memories connected to the AP 210 and the cellular module 221 respectively or at least one of other elements, so as to process the command or data. Furthermore, the AP 1110 or the cellular module 1121 may store, in the nonvolatile memory, data received from or generated by at least one of the other elements.

Each of the Wi-Fi module 1123, the BT module 1125, the GPS module 1127 and the NFC module 1128 may include, for example, a processor for processing data transmitted/received through the modules. FIG. 11 illustrates that the cellular module 1121, the Wi-Fi module 1123, the BT module 1125, the GPS module 1127, and the NFC module 1128 are separate blocks. However, according to an embodiment of the present invention, at least a part (e.g., two or more) of the cellular module 1121, the Wi-Fi module 1123, the BT module 1125, the GPS module 1127, and the NFC module 1128 may be included in a single integrated chip (IC) or IC package. For example, at least a part of processors corresponding to the cellular module 1121, the Wi-Fi module 1123, the BT module 1125, the GPS module 1127 and the NFC module 1128 respectively (e.g., a communication processor corresponding to the cellular module 1121 and a Wi-Fi processor corresponding to the Wi-Fi module 1123) may be implemented with a single SoC.

The RF module 1129 may transmit/receive data, for example, RF signals. For example, a transceiver, a power amp module (PAM), a frequency filter or a Low Noise Amplifier (LNA) may be included in the RF module 1129. Furthermore, the RF module 1129 may further include a component such as a conductor or a wire for transmitting/receiving free-space electromagnetic waves in a wireless communication system. FIG. 11 illustrates that the cellular module 1121, the Wi-Fi module 1123, the BT module 1125, the GPS module 1127, and the NFC module 1128 share the single RF module 1129. However, according to an embodiment of the present invention, at least one of the cellular module 1121, the Wi-Fi module 1123, the BT module 1125, the GPS module 1127, and the NFC module 1128 may transmit/receive RF signals through an additional RF module.

The SIM card 1124 may be inserted into a slot formed at a specific location of the electronic device. The SIM card 1124 may include unique identification information (e.g., an Integrated Circuit Card IDentifier (ICCID)) or subscriber information (e.g., International Mobile Subscriber Identity (IMSI)).

The memory 1130 (e.g., the memory 130) includes an internal memory 1132 and/or an external memory 1134. The internal memory 1132 may include at least one of a volatile memory (e.g., a Dynamic Random Access Memory (RAM) (DRAM), a Static RAM (SRAM) or a Synchronous Dynamic RAM (SDRAM)) or a nonvolatile memory (e.g., a One-Time Programmable ROM (OTPROM), a Programmable ROM (PROM), an Erasable and Programmable ROM (EPROM), an Electronically Erasable and Programmable ROM (EEPROM), a mask ROM, a flash ROM, a NAND flash memory, or a NOR flash memory).

According to an embodiment of the present invention, the internal memory 1132 may be a Solid State Drive (SSD). The external memory 1134 may include a flash drive, for example, Compact Flash (CF), Secure Digital (SD), Micro-SD, Mini-SD, eXtreme Digital (xD) or a memory stick. The external memory 1134 may be functionally connected to the electronic device 1100 through various interfaces. According to an embodiment of the present invention, the electronic device 1100 may further include a storage device (or a storage medium) such as a hard drive.

The sensor module 1140 may measure physical quantity or detect an operation state of the electronic device 1100 so as to convert measured or detected information into an electrical signal. The sensor module 1140 includes, for example, at least one of a gesture sensor 1140A, a gyro sensor 1140B, a barometric pressure sensor 1140C, a magnetic sensor 1140D, an acceleration sensor 1140E, a grip sensor 1140F, a proximity sensor 1140G, a color sensor 1140H (e.g., a red/green/blue (RGB) sensor), a biometric sensor 1140I, a temperature/humidity sensor 1140J, an illumination sensor 1140K, and an UltraViolet (UV) sensor 1140M. Additionally or alternatively, the sensor module 1140 may include, for example, (not shown) an olfactory sensor (E-nose sensor), an ElectroMyoGraphy (EMG) sensor, an ElectroEncephaloGram (EEG) sensor, an ElectroCardioGram (ECG) sensor, an InfraRed (IR) sensor, an iris recognition sensor, or a fingerprint sensor. The sensor module 1140 may further include a control circuit for controlling at least one sensor included therein.

The input device 1150 includes a touch panel 1152, a (digital) pen sensor 1154, a key 1156, and/or an ultrasonic input device 1158. The touch panel 1152 may recognize a touch input using at least one of capacitive, resistive, infrared, and ultraviolet sensing methods. The touch panel 1152 may further include a control circuit. When using the capacitive sensing method, a physical contact recognition or proximity recognition is allowed. The touch panel 1152 may further include a tactile layer, which enables the touch panel 1152 to provide a tactile reaction to a user.

The (digital) pen sensor 1154 may be implemented in a similar or same manner as the method of receiving a touch input of a user or may be implemented using an additional sheet for recognition. The key 1156 may include, for example, a physical button, an optical button, or a keypad. The ultrasonic input device 1158, which is an input device for generating an ultrasonic signal, may enable the electronic device 1100 to sense a sound wave through a microphone (e.g., a microphone 1188) so as to identify data. The ultrasonic input device 1158 is capable of wireless recognition. According to an embodiment of the present invention, the electronic device 1100 may use the communication module 1120 so as to receive a user input from an external device (e.g., a computer or a server) connected to the communication module 1120.

The display module 1160 (e.g., the display 150) includes a panel 1162, a hologram device 1164, and/or a projector 1166. The panel 1162 may be, for example, a Liquid Crystal Display (LCD) or an Active-Matrix Organic LED (AM-OLED) display. The panel 1162 may be, for example, flexible, transparent or wearable. The panel 1162 and the touch panel 1152 may be integrated into a single module. The hologram device 1164 may display a stereoscopic image in a space using a light interference phenomenon. The projector 1166 may project light onto a screen so as to display an image. The screen may be disposed in the inside or the outside of the electronic device 1100. According to an embodiment of the present invention, the display 1160 may further include a control circuit for controlling the panel 1162, the hologram device 1164, or the projector 1166.

The interface 1170 includes, for example, an HDMI interface 1172, a USB interface 1174, an optical interface 1176, and/or a D-subminiature interface 1178. The interface 1170 may be included in the communication interface 160 illustrated in FIG. 1. Additionally or alternatively, the interface 1170 may include, for example, a Mobile High-definition Link (MHL) interface, an SD card/Multi-Media Card (MMC) interface, or an Infrared Data Association (IrDA) interface.

The audio module 1180 may convert a sound into an electrical signal or vice versa. At least a part of elements of the audio module 1180 may be included in the input/output interface 140 illustrated in FIG. 1. The audio module 1180 may process sound information input or output through a speaker 1182, a receiver 1184, an earphone 1186, or the microphone 1188.

According to an embodiment of the present invention, the camera module 1191 for shooting a still image or a video may include at least one image sensor (e.g., a front sensor or a rear sensor), a lens, an image signal processor (ISP), or a flash (e.g., an LED or a xenon lamp).

The power management module 1195 may manage power of the electronic device 1100. A Power Management Integrated Circuit (PMIC), a charger Integrated Circuit (IC), or a battery gauge may be included in the power management module 1195.

The PMIC may be mounted on an integrated circuit or an SoC semiconductor. A charging method may be classified as a wired charging method or a wireless charging method. The charger IC may charge a battery, and may prevent an overvoltage or an overcurrent from being introduced from a charger. According to an embodiment of the present invention, the charger IC may include a charger IC for at least one of the wired charging method and the wireless charging method. The wireless charging method may include, for example, a magnetic resonance method, a magnetic induction method or an electromagnetic method, and may include an additional circuit, for example, a coil loop, a resonant circuit, or a rectifier.

The battery gauge may measure, for example, a remaining capacity of the battery 1196 and a voltage, current or temperature thereof while the battery is charged. The battery 1196 may store or generate electricity, and may supply power to the electronic device 1100 using the stored or generated electricity. The battery 1196 may include, for example, a rechargeable battery or a solar battery.

The indicator 1197 may indicate a specific state of the electronic device 1100 or a part thereof (e.g., the AP 1110), such as a booting state, a message state, or a charging state. The motor 1198 may convert an electrical signal into a mechanical vibration. A processing device (e.g., a GPU) for supporting a mobile TV may be included in the electronic device 1100. The processing device for supporting a mobile TV may process media data according to the standards of Digital Multimedia Broadcasting (DMB), Digital Video Broadcasting (DVB) or media flow.

Each of the above-described elements of the electronic device according to an embodiment of the present invention may be configured with one or more components, and the names of the elements may be changed according to the type of the electronic device. The electronic device according to an embodiment of the present invention may include at least one of the above-described elements, and some elements may be omitted or other additional elements may be added. Furthermore, some of the elements of the electronic device according to an embodiment of the present invention may be combined with each other so as to form one entity, so that the functions of the elements may be performed in the same manner as before the combination.

According to an embodiment of the present invention, an electronic device may include a channel quality measuring module configured to measure a channel quality of a received signal, a bias offset determining module configured to determine a bias offset based on the measured channel quality, a bias offset applying module configured to modify a bias by applying the determined bias offset to a specified bias value, and a power amplifier configured to amplify transmission power according to the modified bias.

According to an embodiment of the present invention, the channel quality measuring module may re-measure the channel quality after the transmission power is amplified, the bias offset applying module may determine a re-modified bias by applying the determined bias offset to the modified bias based on the re-measured channel quality, and the power amplifier may amplify the transmission power according to the re-modified bias.

According to an embodiment of the present invention, the channel quality measuring module may measure the channel quality when channel handover occurs.

According to an embodiment of the present invention, the received signal may be received through a plurality of channels, and the bias offset determining module may classify the plurality of channels according to a frequency, and may determine bias offsets to be applied to each of the classified channels.

According to an embodiment of the present invention, at least a portion of the determined bias offsets may have a value of 0.

According to an embodiment of the present invention, the bias offset determining module may classify the plurality of channels into a high-frequency group, a middle-frequency group, and a low-frequency group, and may equally set a primary bias for the high-frequency group and the low-frequency group if the channel quality is at least a specified level.

According to an embodiment of the present invention, the channel quality measuring module may measure a BLER of the received signal, and the bias offset determining module may determine a first bias offset having a positive value if the BLER is equal to or larger than a specified rate, or may determine a second bias offset having a negative value if the BLER is less than the specified rate.

According to an embodiment of the present invention, the channel quality measuring module may measure transmission power of a transmission signal, and the bias offset determining module may determine a positive bias offset if the transmission power is equal to or larger than a specified value.

According to an embodiment of the present invention, the specified value may be set to be a power value at which reception sensitivity of the received signal is degraded by the transmission signal. For example, the received signal may be received through the channel 10838CH, and the specified value may be set to be about 15 dBm.

According to an embodiment of the present invention, the electronic device may support Carrier Aggregation (CA) (e.g., CA according to LTE-A). For example, the electronic device may support high-speed communication using at least two frequency bands compared to the case of using one frequency band.

According to an embodiment of the present invention, the channel quality may be set to be at least one of a BLER, a BER, a FER, a transmission power level, an RSRP, an RB number, or an RB position.

According to an embodiment of the present invention, an electronic device may include a communication module configured to measure a channel quality of a received signal, a bias offset determining module configured to determine a bias offset based on the measured channel quality, a bias offset applying module configured to apply the determined bias offset to a specified bias value, and a bias storing module configured to store the bias value to which the bias offset is applied in a bias look-up table.

According to an embodiment of the present invention, the communication module may drive a power amplifier using a bias value obtained from the bias look-up table based on a channel and transmission power.

According to an embodiment of the present invention, the specified bias value may be stored in advance based at least on comparison between a reference margin and an ACLR measured from an arbitrary channel.

According to an embodiment of the present invention, the channel quality may be a BER or FER, and the bias offset determining module may determine a bias offset having a positive value if the measured BER is greater than a reference BER.

According to an embodiment of the present invention, the channel quality may be a transmission power level, and the bias offset determining module may determine a bias offset having a positive value if the transmission power level falls within a specified range.

The term "module" used herein may represent, for example, a unit including one or more combinations of hardware, software and firmware. The term "module" may be interchangeably used with the terms "unit", "logic", "logical block", "component" and "circuit". A "module" may be a minimum unit of an integrated component or may be a part thereof. A "module" may be a minimum unit for performing one or more functions or a part thereof. A "module" may be implemented mechanically or electronically. For example, a module according to an embodiment of the present invention may include at least one of an Application-Specific Integrated Circuit (ASIC) chip, a Field-Programmable Gate Array (FPGA), or a programmable-logic device for performing some operations, which are known or will be developed.

According to an embodiment of the present invention, at least a part of devices (e.g., modules or functions thereof) or methods (e.g., operations) according to an embodiment of the present invention may be implemented as instructions stored in a computer-readable storage medium in the form of a programming module. When the instructions are performed by at least one processor (e.g., the processor 1110), the at least one processor may perform functions corresponding to the instructions. The computer-readable storage medium may be, for example, the memory 1130. At least a part of the programming module may be implemented (e.g., executed) by the processor 1010. At least a part of the programming module may include, for example, a module, program, routine, sets of instructions, or process for performing at least one function.

The computer-readable storage medium may include a magnetic medium such as, for example, a hard disk, a floppy disk and a magnetic tape, an optical medium such as a Compact Disc (CD)-ROM and a DVD, a magneto-optical medium such as, for example, a floptical disk, and a hardware device configured to store and execute program instructions (e.g., a programming module), such as, for example, a ROM, a RAM and a flash memory. The program instructions may include machine language codes generated by compilers and high-level language codes that can be executed by computers using interpreters. The above-described hardware may be configured to be operated as one or more software modules for performing operations of various embodiments of the present invention and vice versa.

A module or programming module, according to various embodiments of the present invention, may include at least one of the above-described elements, or some elements may be omitted or other additional elements may be added. Operations performed by the module, the programming module or the other elements may be performed in a sequential, parallel, iterative or heuristic way. Furthermore, some operations may be performed in another order or may be omitted, or other operations may be added.

According to an embodiment of the present invention, current consumption may be reduced and reception sensitivity may be improved by differently setting a PA bias according to channels, even if the channels belong to the same band. Furthermore, according to an embodiment of the present invention, the desensitization phenomenon which may occur in some channels due to leakage of a transmission signal may be reduced, and a PA bias may be adaptively and appropriately controlled according RFFE hardware characteristics. Although some embodiments of the present invention herein refer to the electronic device as a user terminal communicating with a base station, for example, embodiments of the present invention are not limited thereto. According to embodiments of the present invention, the electronic device may be a user terminal (e.g., a portable terminal), a base station, relay station, or other such device.

While the invention has been shown and described with reference to certain embodiments thereof, it will be understood by those skilled in the art that various changes in form and detail may be made therein without departing from the spirit and scope of the invention as defined by the appended claims and their equivalents.

What is claimed is:
1. An electronic device comprising:
a memory configured to store pre-defined bias values, the pre-defined bias values including a first bias value corresponding to a first frequency channel and a pre-determined transmission power level;
a receiver configured to receive a signal of a specific band through an antenna, wherein the specific band comprises a plurality of frequency channels including the first frequency channel and a second frequency channel and the received signal corresponds to the second frequency channels;
a channel quality measuring module configured to measure a channel quality of the second frequency channel based on the received signal;
a bias offset determining module configured to determine a bias offset based on the measured channel quality of the second frequency channel;

a bias offset applying module configured to modify the first bias value by applying the determined bias offset to the first bias value;

a power amplifier configured to amplify transmission power of a transmission signal to be transmitted through the first frequency channel according to the modified first bias value; and a transmitter configured to transmit the transmission signal at the predetermined transmission power level through the first frequency channel.

2. The electronic device of claim 1, wherein the channel quality measuring module is further configured to re-measure the channel quality after the transmission power is amplified, wherein the bias offset determining module is further configured to re-determine the bias offset based on the re-measured channel quality;

wherein the bias offset applying module is further configured to re-modify the bias by applying the re-determined bias offset to the modified first bias value, and wherein the power amplifier is further configured to re-amplify the transmission power according to the re-modified bias.

3. The electronic device of claim 1, wherein the channel quality measuring module measures the channel quality if channel handover occurs.

4. The electronic device of claim 1, wherein the received signal is received through a plurality of channels, and wherein the bias offset determining module is further configured to classify the plurality of channels according to a frequency of each channel, and determines at least one respective bias offset to be applied to each of the plurality of channels.

5. The electronic device of claim 1, wherein at least one of the determined respective bias offsets has a value of 0.

6. The electronic device of claim 1, wherein the channel quality measuring module measures a Block Error Rate (BLER) of the received signal, and wherein the bias offset determining module determines a first bias offset having a positive value if the BLER is equal to or larger than a specified rate, and determines a second bias offset having a negative value if the BLER is less than the specified rate.

7. The electronic device of claim 1, wherein the channel quality measuring module is further configured to measure a transmission power of a transmission signal, and wherein the determined bias offset determining has a value if the transmission power is at least equal to a specified value.

8. The electronic device of claim 7, wherein the specified value is set to be a power value at which a reception sensitivity of the received signal is degraded to at least a certain degree due to leakage of the transmission signal.

9. The electronic device of claim 1, wherein the electronic device supports carrier aggregation.

10. The electronic device of claim 1, wherein the channel quality is set to be at least one of a BLER, a Bit Error Rate (BER), a Frame Error Rate (FER), a Transmission (Tx) power level, Reference Signal Received Power (RSRP), a Resource Block (RB) number, an RB position, Chip Energy/Others Interference (Ec/Io), or Received Signal Code Power (RSCP).

11. The electronic device of claim 1, wherein the electronic device is a portable terminal.

12. An electronic device comprising:

a memory configured to store pre-defined bias values, the pre-defined bias values including a first bias value corresponding to a first frequency channel and a pre-determined transmission power level;

a receiver configured to receive a signal of a specific band through an antenna, wherein the specific band comprises a plurality of frequency channels including the first frequency channel and a second frequency channel and the received signal corresponds to the second frequency channel;

a communication module configured to measure a channel quality of the second frequency channel based on the received signal;

a bias offset determining module configured to determine a bias offset based on the measured channel quality of the second frequency channel;

a bias offset applying module configured to apply the determined bias offset to the first bias value; and a bias storing module configured to store the bias value to which the bias offset is applied in a bias look-up table.

13. The electronic device of claim 12, wherein the communication module drives a power amplifier using a bias value obtained from the bias look-up table based on a channel and transmission power.

14. The electronic device of claim 12, wherein the first bias value is stored in advance based at least one comparison between a reference margin and an Adjacent Channel Leakage Ratio (ACLR) measured from the second frequency channel.

15. The electronic device of claim 12, wherein the channel quality is a Bit Error Rate (BER) or a Frame Error rate (FER), and wherein the determined bias offset has a positive value if the measured BER is greater than a reference BER.

16. The electronic device of claim 12, wherein the channel quality corresponds to a transmission power level, and wherein the determined bias offset has a positive value if the transmission power level falls within a specified range.

17. A bias control method of an electronic device, wherein the electronic device comprises a memory storing pre-defined bias values, the pre-defined bias values including a first bias value corresponding to a first frequency channel and a predetermined transmission power level, the method comprising:

receiving a signal of a specific band through an antenna, wherein the specific band comprises a plurality of frequency channels including the first frequency channel and a second frequency channel and the received signal corresponds to the second frequency channels;

measuring a channel quality of the second frequency channel based on the received signal;

determining a bias offset based on the measured channel quality of the second frequency channel;

applying the determined bias offset to the first bias value; and amplifying transmission power of a transmission signal to be transmitted through the first frequency channel according to the bias value to which the bias offset is applied.

18. The bias control method of claim 17, wherein the measurement of the channel quality, the determination of the bias offset, the application of the determined bias, and the amplification of the transmission power are performed in response to a determination that a handover occurs.

19. The bias control method of claim 17, wherein the measuring the channel quality is performed at a specified range of a Received Signal Strength Indication (RSSI).

20. The bias control method of claim 17, wherein the application of the determined bias offset to the first bias value is performed on a bias for the first frequency channel corresponding to the second frequency channel in which the channel quality is measured.

* * * * *